(12) United States Patent
Matsumoto

(10) Patent No.: US 8,334,747 B2
(45) Date of Patent: Dec. 18, 2012

(54) COIL-INTEGRATED SWITCHING POWER SUPPLY MODULE

(75) Inventor: Tadahiko Matsumoto, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 13/352,592

(22) Filed: Jan. 18, 2012

(65) Prior Publication Data

US 2012/0112866 A1 May 10, 2012

Related U.S. Application Data

(63) Continuation of application No. PCT/JP2010/056162, filed on Apr. 5, 2010.

(30) Foreign Application Priority Data

Jul. 23, 2009 (JP) ................................ 2009-171942

(51) Int. Cl.
*H01F 5/00* (2006.01)
(52) U.S. Cl. ...................................... 336/200
(58) Field of Classification Search ............... 336/55–61, 336/200, 232, 220–223
See application file for complete search history.

(56) References Cited

U.S. PATENT DOCUMENTS

| | | | |
|---|---|---|---|
| 4,873,757 A * | 10/1989 | Williams | 29/602.1 |
| 5,929,733 A | 7/1999 | Anzawa et al. | |
| 6,281,779 B1 | 8/2001 | Matsumoto et al. | |
| 6,380,836 B2 * | 4/2002 | Matsumoto et al. | 336/200 |
| 6,980,074 B1 * | 12/2005 | Jitaru | 336/200 |
| 7,132,921 B2 * | 11/2006 | Eguchi et al. | 336/200 |
| 2002/0003715 A1 | 1/2002 | Matsumoto et al. | |
| 2002/0057158 A1 | 5/2002 | Matsumoto et al. | |
| 2008/0239759 A1 | 10/2008 | Nakahori | |

FOREIGN PATENT DOCUMENTS

| | | |
|---|---|---|
| JP | 6-325949 A | 11/1994 |
| JP | 7-86755 A | 3/1995 |
| JP | 2000-260639 A | 9/2000 |
| JP | 2001-359281 A | 12/2001 |
| JP | 2002-15927 A | 1/2002 |
| JP | 2004-349293 A | 12/2004 |
| JP | 2008-253113 A | 10/2008 |
| JP | 2009-224725 A | 10/2009 |

OTHER PUBLICATIONS

Official Communication issued in International Patent Application No. PCT/JP2010/056162, mailed on Jun. 8, 2010.

* cited by examiner

*Primary Examiner* — Tuyen Nguyen
(74) *Attorney, Agent, or Firm* — Keating & Bennett, LLP

(57) ABSTRACT

A coil-integrated switching power supply module that provides an improved heat radiation effect to keep the temperature of the entire coil-integrated switching power supply module to a lower value includes a thermal diffusion conductor pattern arranged around a hole through which a magnetic core extends on a layer. The thermal diffusion conductor pattern continuously extends in areas where coil conductor patterns are located on other layers and outside areas where the coil conductor patterns are located on the other layers. In addition, the thermal diffusion conductor pattern includes slits at portions thereof and does not define a closed loop around the hole through which the magnetic core extends.

4 Claims, 12 Drawing Sheets

COIL-INTEGRATED SWITCHING POWER SUPPLY MODULE

BACKGROUND OF THE INVENTION

1. Field of the Invention

The present invention relates to a coil-integrated switching power supply module including a transformer including a power transfer-voltage conversion function between a primary side and a secondary side.

2. Description of the Related Art

Japanese Unexamined Patent Application Publication No. 2000-260639, Japanese Unexamined Patent Application Publication No. 2004-349293, and Japanese Patent Application No. 3196187 each disclose a sheet transformer and an insulated switching power supply using the sheet transformer. The sheet transformer has a structure in which the wiring patterns of a primary wiring and a secondary wiring are formed on multiple substrates, through holes are provided in a multilayer substrate having the multiple substrates stacked therein, and the multilayer substrate is sandwiched with a ferrite core from both sides.

FIG. 1 and FIG. 2 of the present application correspond to FIG. 3 and FIG. 4 of Japanese Patent Application No. 3196187. FIG. 1 is an equivalent circuit diagram of an insulated direct current (DC)-DC converter. FIG. 2 is a perspective view showing the structure of the circuit in FIG. 1, which describes how the circuit is mounted. The core of a transformer T is mounted at a central portion of a wiring layer 20, a switching element Q1, such as a field effect transistor (FET) or a transistor, is provided at a primary side of the transformer T, and diodes D3 and D4 and the core member of a choke coil L1 are provided at a secondary side of the transformer T. A shield layer 30 is provided immediately below the wiring layer 20 and a coil inner wiring layer 12 is provided below the shield layer 30.

Wiring patterns between inter-layer connection holes of the wiring layer 20 to a coil layer 10 and a capacitor layer are provided in the coil inner wiring layer 12, and the wiring layer 20 and the coil inner wiring layer 12 compose two wiring areas.

The coil layer 10 is provided below the coil inner wiring layer 12. A primary winding n1 and a secondary winding n2 of the transformer T are stacked in the coil layer 10, and the coil layer 10 is positioned so as to be magnetically affected by the core T mounted on the wiring layer 20. In addition, a wiring n3 for the choke coil L1 is also provided in the coil layer 10 at a position corresponding to the position where the core member of the choke coil L1 is arranged. The capacitor layer 40 is provided below the coil inner wiring layer 12 and an output capacitor C2 is provided in the capacitor layer 40.

Japanese Patent Application No. 3196187 differs from Japanese Unexamined Patent Application Publication No. 2000-260639 and Japanese Unexamined Patent Application Publication No. 2004-349293 in that a coil pattern composing the transformer is provided in the multilayer substrate and only electronic components, the ferrite core, etc. are mounted on the surface layer. Since the wiring layer and the shield layer are required to be provided outside the coil pattern layer in such a structure, at least four layers including the surface-side layers and bottom-side layers are not used for the coils. Accordingly, it is necessary to increase the number of layers of the substrate in order to set the conductive resistance of the coils to a sufficiently low value. However, the increase in the number of layers of the substrate causes a problem in that the manufacturing cost of the substrate is greatly increased. In addition, there is a problem in that the thickness of the substrate is also increased in association with the increase in the number of layers to increase the thickness of the product. In contrast, it is relatively easy to provide a measure against a leakage flux from the transformer and/or the choke coil by not arranging a circuit having a low noise tolerance in a region where the leakage flux remarkably occurs. Accordingly, the structure in which the coil patterns are formed also on the surface of the substrate, as shown in Japanese Unexamined Patent Application Publication No. 2000-260639 and Japanese Unexamined Patent Application Publication No. 2004-349293, is more common.

Coil-integrated switching power supply modules in the related art each including a multilayer substrate in which spiral coil conductor patterns are formed on multiple layers and a magnetic core that extends through the multilayer substrate to compose a closed magnetic circuit have the following problems.

The multilayer substrate in which spiral coil conductor patterns are formed on multiple layers and the magnetic core that extends through the multilayer substrate to compose a closed magnetic circuit are used to form a transformer or an inductor in the coil-integrated switching power supply module. However, when the transformer or the inductor processes high power, large current flows through the spiral coil conductor patterns to make heat generation in the coil conductor patterns remarkable. The heat generated in the coil conductor patterns is transferred in a direction toward the periphery of the magnetic core and the multilayer substrate and is radiated outside from the magnetic core, the multilayer substrate, input-output terminals of the coil-integrated switching power supply module, and so on.

One object of the coil-integrated switching power supply module is to reduce the number of components and reduce the size of the coil-integrated switching power supply module and the size of the multilayer substrate is also preferred to be reduced as much as possible. Accordingly, heat concentration is likely to occur in the coil conductor patterns in association with the reduction in size of the entire coil-integrated switching power supply module. If the upper temperature limit of a material of the multilayer substrate is exceeded because of the heat concentration in the coil conductor patterns, color change and/or deformation of the multilayer substrate are caused thereby greatly degrading reliability. In addition, the components mounted near the coil conductor patterns are also adversely affected. When it is not possible to mount a fan for cooling the coil-integrated switching power supply module or a case in which the coil-integrated switching power supply module is housed or when the environmental temperature is high, the problem of the heat radiation gets worse.

SUMMARY OF THE INVENTION

Preferred embodiments of the present invention provide a coil-integrated switching power supply module that provides greatly improved reliability of a multilayer substrate and peripheral components by improving the heat radiation effect to prevent heat concentration.

A coil-integrated switching power supply module according to a preferred embodiment of the present invention includes a multilayer substrate in which spiral coil conductor patterns are provided on multiple layers, holes are located at an inner side and an outer side of each of the coil conductor patterns, and circuit element mounting electrodes are located on outer surfaces of the multilayer substrate; a magnetic core that extends through the holes located at the inner side and the outer side of each of the coil conductor patterns of the multilayer substrate to define a closed magnetic circuit; and circuit elements mounted on the circuit element mounting electrodes. A thermal diffusion conductor pattern is located on an inner layer of the multilayer substrate. The thermal diffusion conductor pattern continuously extends in areas where the coil conductor patterns are located and outside areas where the coil conductor patterns are located and does not define a closed loop around the hole through which the magnetic core extends (does not extend around the hole).

Among the coil conductor patterns, at least one coil conductor pattern includes one turn and is an expansion coil conductor pattern that continuously extends outside the areas where the coil conductor patterns are located.

A thermal coupling member for heat radiation (heat transfer) to an external heat radiation member (e.g., a heat sink or a case) is provided on at least one outer surface of the multilayer substrate and conductor through holes are provided between the thermal diffusion conductor pattern or the expansion coil conductor pattern and the thermal coupling member.

Various preferred embodiments of the present invention provide the following advantageous effects.

The thermal diffusion conductor pattern or the expansion coil conductor pattern located on the inner layer of the multilayer substrate has a low thermal resistance. Accordingly, the heat radiated from the spiral coil conductor patterns is efficiently diffused in all directions with the thermal diffusion conductor pattern or the expansion coil conductor pattern located on the inner layer of the multilayer substrate. Consequently, the areas where the coil conductor patterns are provided in the multilayer substrate are prevented from being at high temperature intensively to keep the temperature of the entire coil-integrated switching power supply module at a low value.

In addition, the heat of the thermal diffusion conductor pattern or the expansion coil conductor pattern is efficiently radiated outside through the through holes and the thermal coupling member.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

First Preferred Embodiment

A coil-integrated switching power supply module according to a first preferred embodiment will now be described with reference to FIGS. 3 to 13.

Figure 1:
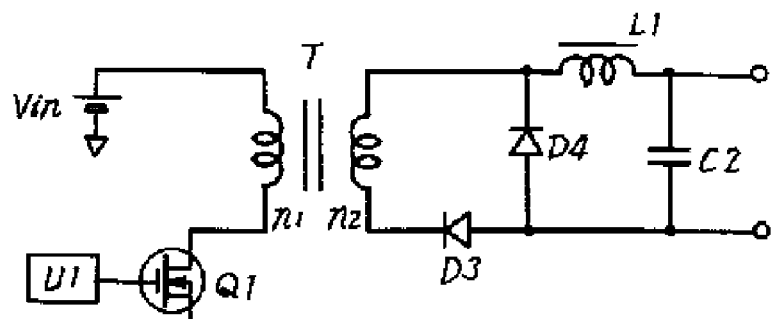
FIG. 1 is an equivalent circuit diagram of an insulated DC-DC converter of the related art.
Figure 2:
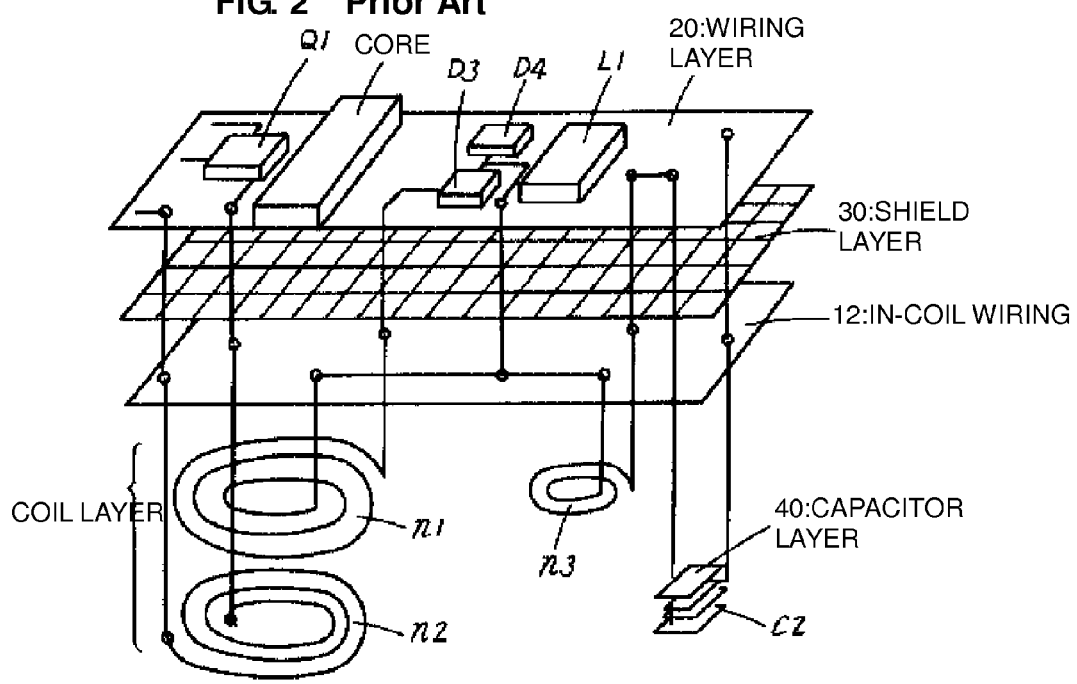
FIG. 2 is a perspective view showing the structure of the circuit in FIG. 1, which illustrates how the circuit is mounted.
Figure 3:
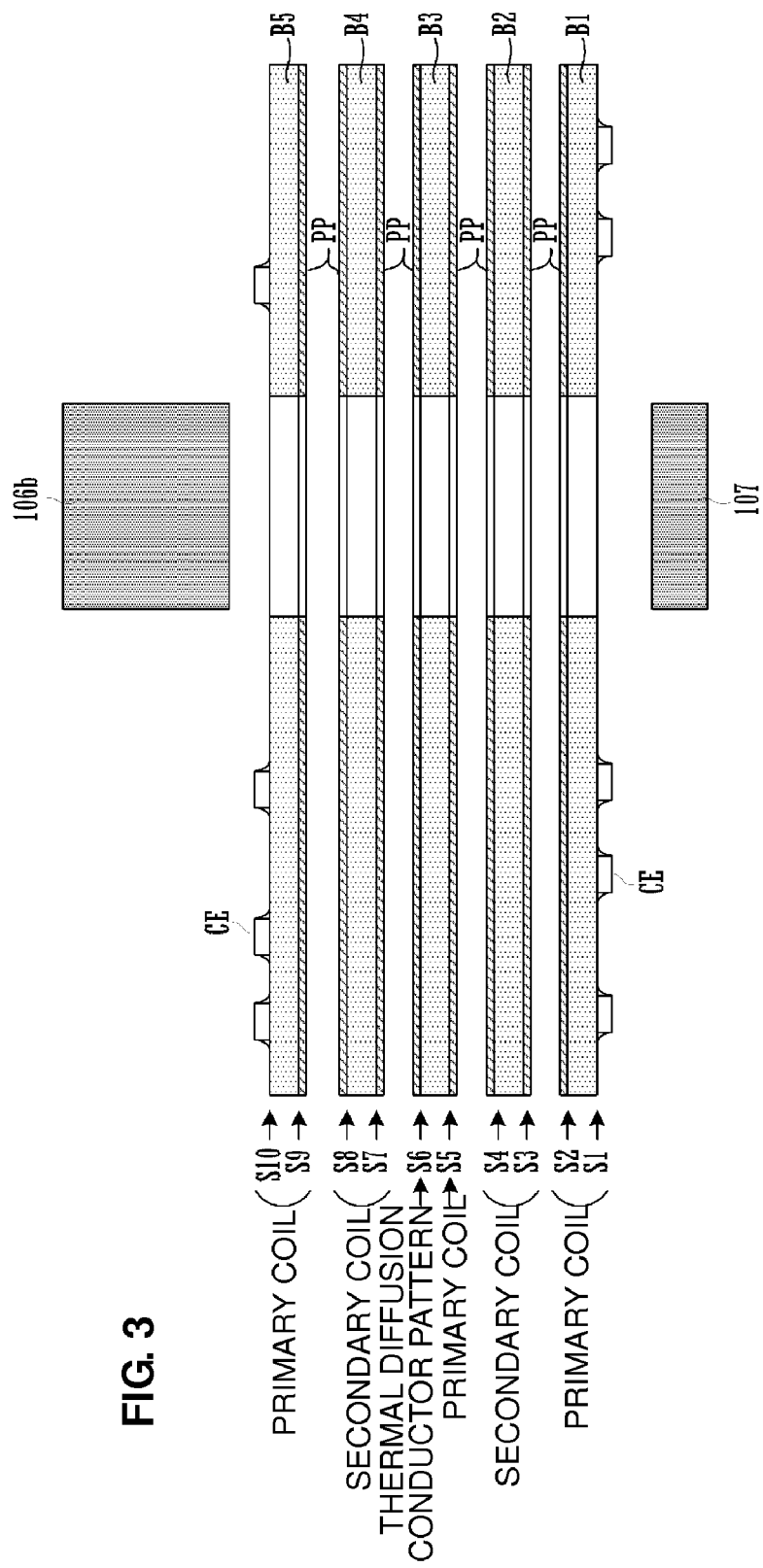
FIG. 3 is an exploded cross-sectional view of a coil-integrated switching power supply module according to a first preferred embodiment of the present invention.

FIG. 3 is an exploded cross-sectional view of the coil-integrated switching power supply module. A multilayer substrate provided in the coil-integrated switching power supply module includes five double-sided substrates B1, B2, B3, B4, and B5 in this example and prepregs are provided between adjacent double-sided substrates. Since the multilayer substrate includes the five double-sided substrates, the multilayer substrate preferably includes ten layers (layers S1 to S10), for example.

Among the layers S1 to S10, circuit element mounting electrodes (e.g., lands) are located on the first layer S1 and the tenth layer S10, which are outermost layers, and circuit elements CE are mounted on the electrodes. Since inner via holes are capable of being formed between the first layer and the second layer and between the ninth layer and the tenth layer, patterns on the second layer and the ninth layer can be easily connected to the first layer and the tenth layer, respectively. Accordingly, many wiring patterns for electrical connection between the circuit elements extend on the second layer S2 and the ninth layer S9.

Consequently, it is practically not possible to form thermal diffusion conductor patterns across wide ranges on the first layer, the second layer, the ninth layer, and the tenth layer.

Since many wiring patterns are not required to extend on the inner layers other than the first layer, the second layer, the ninth layer, and the tenth layer, it is possible to form the thermal diffusion conductor patterns on the inner layers without restricting the formation of other wiring patterns.

A thermal diffusion conductor pattern is formed on the sixth layer S6, which is the innermost layer, in the first preferred embodiment. Spiral coil conductor patterns are formed on the remaining layers S1 to S5 and S7 to S10.

Holes are located at the inner side and the outer side of each of the coil conductor patterns and a magnetic core that extends through the holes to define a closed magnetic circuit is provided in the multilayer substrate. A central magnetic leg 106b and a magnetic core 107 appear in FIG. 3.

FIG. 4 to FIG. 13 are plan views of conductor patterns located on the layers S1 to S10 shown in FIG. 3. However, the drawings of all the layers are viewed from one side of the multilayer substrate. Main conductor patterns (particularly, coil conductor patterns) are shown and other conductor patterns are not shown in FIG. 4 to FIG. 13. In any of FIG. 4 to FIG. 13, the leg portion of the magnetic core extends through holes H1, H2, H3.

Figure 4:
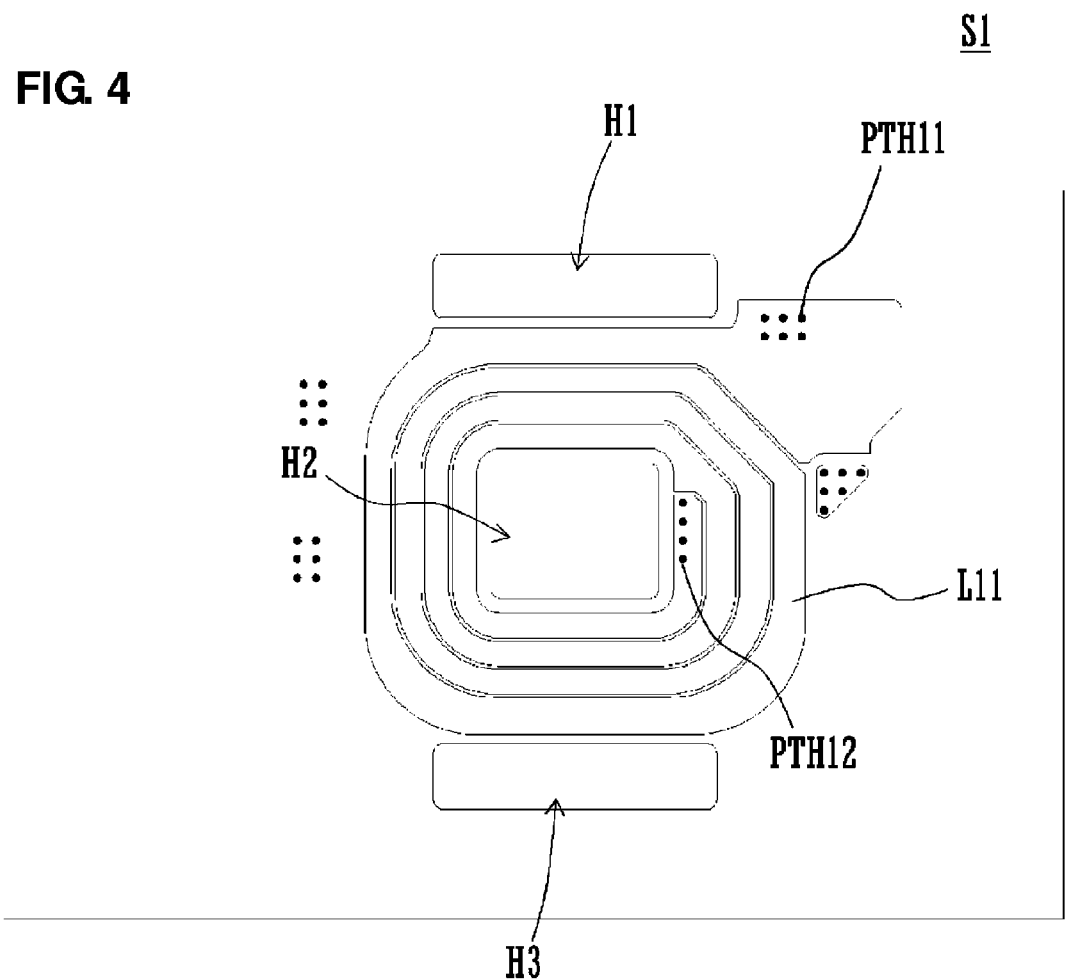
FIG. 4 is a plan view of a conductor pattern located on a layer S1 of a multilayer substrate shown in FIG. 3.

As shown in FIG. 4, a spiral four-turn coil conductor pattern L11 is preferably arranged around the hole H2 on the layer S1. Conductor through holes PTH11 are located at the outer periphery end of the coil conductor pattern L11, and conductor through holes PTH12 are located at the inner periphery end of the coil conductor pattern L11.

Figure 5:
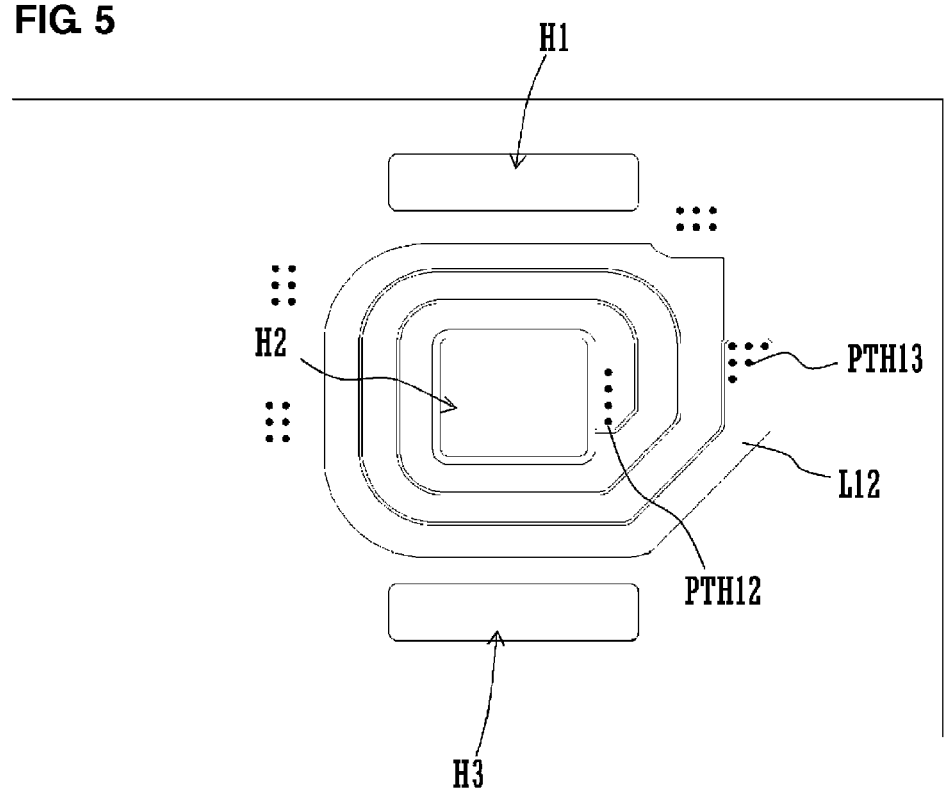
FIG. 5 is a plan view of a conductor pattern located on a layer S2 of the multilayer substrate shown in FIG. 3.

As shown in FIG. 5, a spiral three-turn coil conductor pattern L12 is arranged around the hole H2 on the layer S2. The conductor through holes PTH12 are located at the inner periphery end of the coil conductor pattern L12, and conductor through holes PTH13 are located at the outer periphery end of the coil conductor pattern L12.

The coil conductor pattern L11 is connected in series to the coil conductor pattern L12 via the conductor through holes PTH12 in the above manner to define a coil having a total of seven turns.

Figure 6:
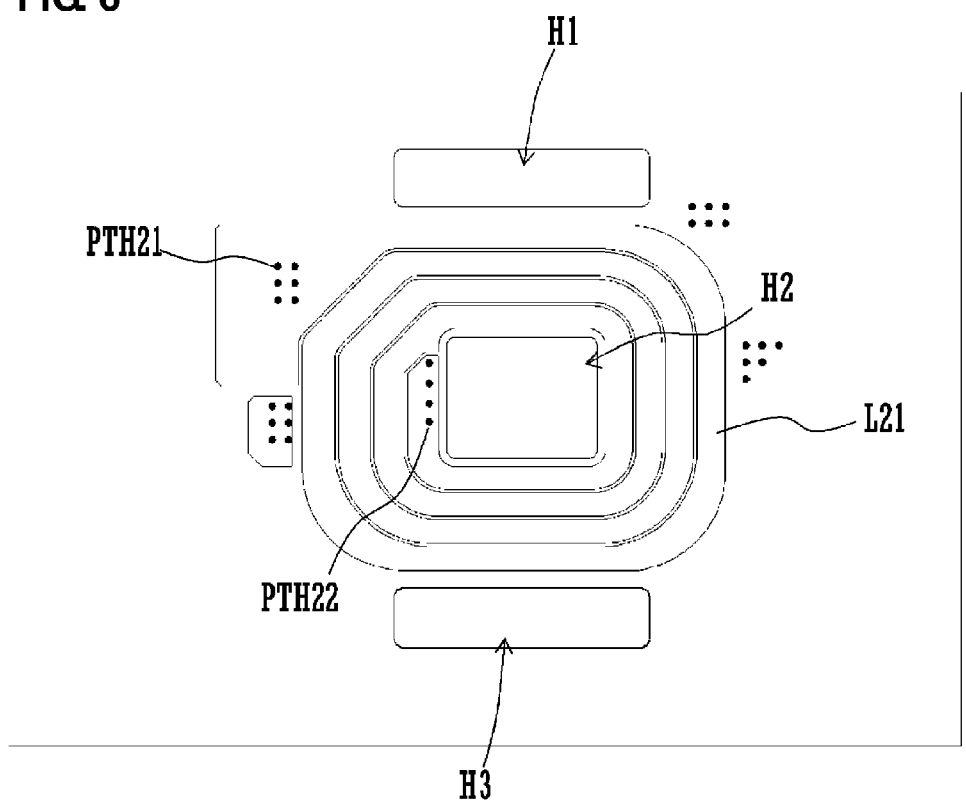
FIG. 6 is a plan view of a conductor pattern located on a layer S3 of the multilayer substrate shown in FIG. 3.

As shown in FIG. 6, a four-turn spiral coil conductor pattern L21 is preferably arranged around the hole H2 on the layer S3. Conductor through holes PTH21 are located at the outer periphery end of the coil conductor pattern L21, and conductor through holes PTH22 are located at the inner periphery end of the coil conductor pattern L21.

Figure 7:
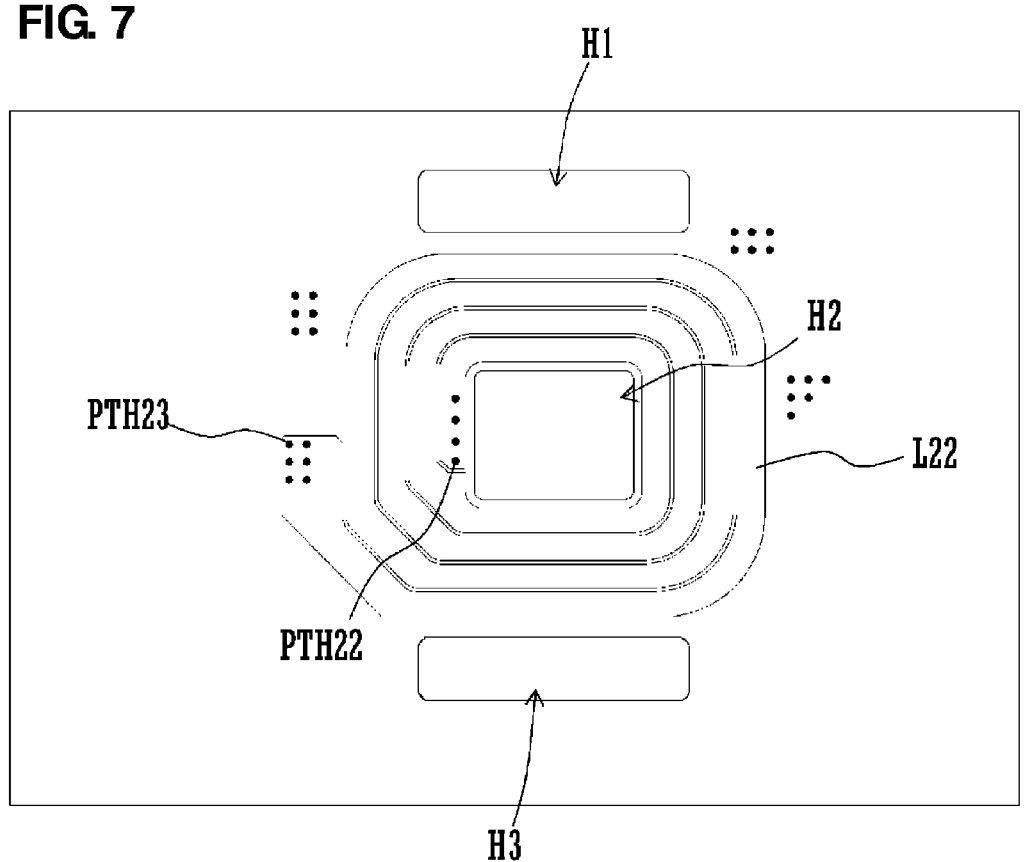
FIG. 7 is a plan view of a conductor pattern located on a layer S4 of the multilayer substrate shown in FIG. 3.

As shown in FIG. 7, a spiral four-turn coil conductor pattern L22 is preferably arranged around the hole H2 on the layer S4. The conductor through holes PTH22 are located at the inner periphery end of the coil conductor pattern L22, and conductor through holes PTH23 are located at the outer periphery end of the coil conductor pattern L22.

The coil conductor pattern L21 is connected in series to the coil conductor pattern L22 via the conductor through holes PTH22 in the above manner to define a coil having a total of eight turns.

Figure 8:
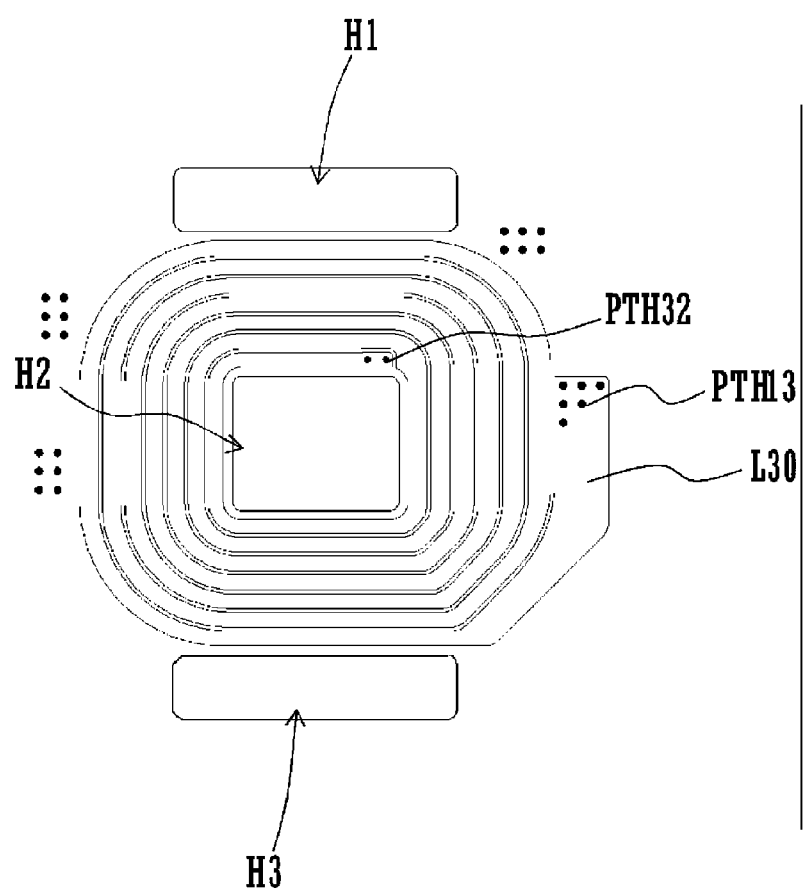
FIG. 8 is a plan view of a conductor pattern located on a layer S5 of the multilayer substrate shown in FIG. 3.

As shown in FIG. 8, a spiral seven-turn coil conductor pattern L30 is preferably arranged around the hole H2 on the layer S5. The conductor through holes PTH13 are located at the outer periphery end of the coil conductor pattern L30, and conductor through holes PTH32 are located at the inner periphery end of the coil conductor pattern L30.

Figure 9:
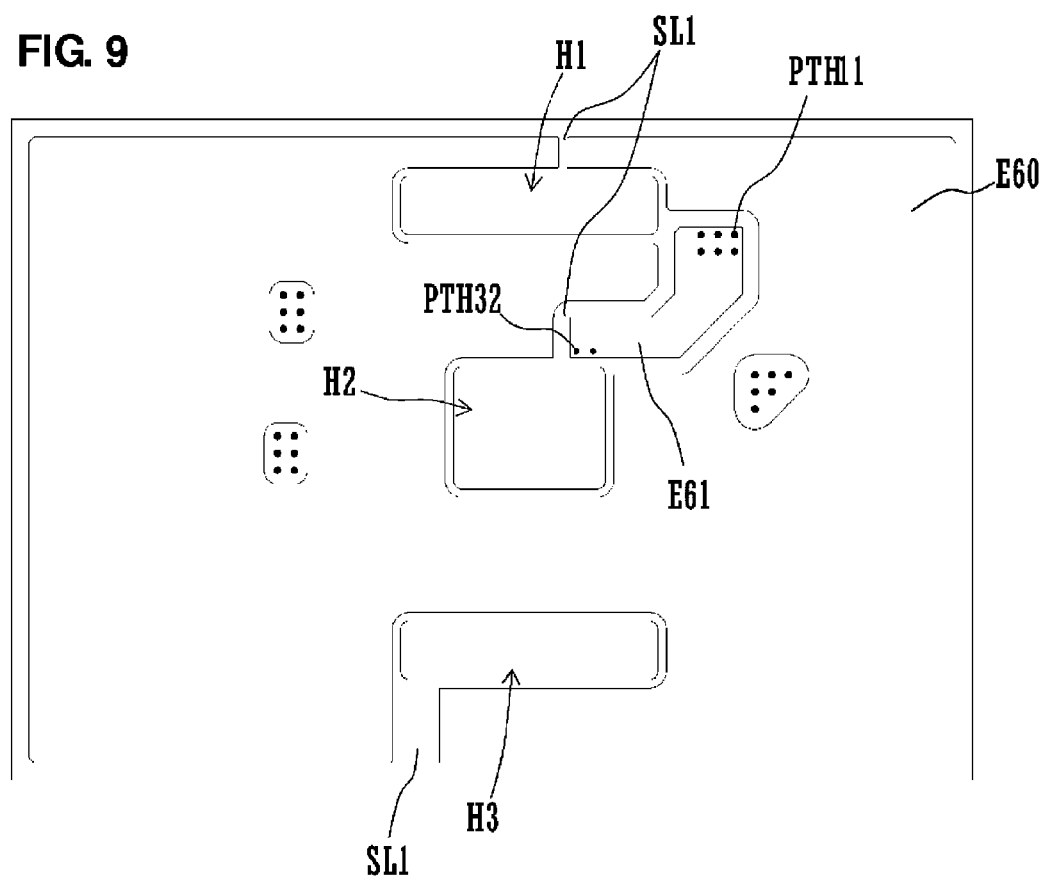
FIG. 9 is a plan view of conductor patterns located on a layer S6 of the multilayer substrate shown in FIG. 3.

As shown in FIG. 9, a thermal diffusion conductor pattern E60 is preferably arranged around the hole H2 on the layer S6. The thermal diffusion conductor pattern E60 continuously extends in the areas where the coil conductor patterns are located and outside the areas where the coil conductor patterns are located. In this example, the thermal diffusion conductor pattern E60 preferably extends into the periphery of the substrate. In addition, the thermal diffusion conductor pattern E60 includes slits SL1 at portions thereof and does not define a closed loop around the hole H2 through which the magnetic core extends (does not extend around the hole H2).

A conductor pattern E61 is located on the layer S6, in addition to the thermal diffusion conductor pattern E60. The conductor through holes PTH32 are located at a first end of the conductor pattern E61 and the conductor through holes PTH11 are located at a second end of the conductor pattern E61. The coil conductor pattern L30 located on the layer S5 is connected in series to the return line E61 on the layer S6 via the conductor through holes PTH32 to define a seven-turn coil.

Figure 10:
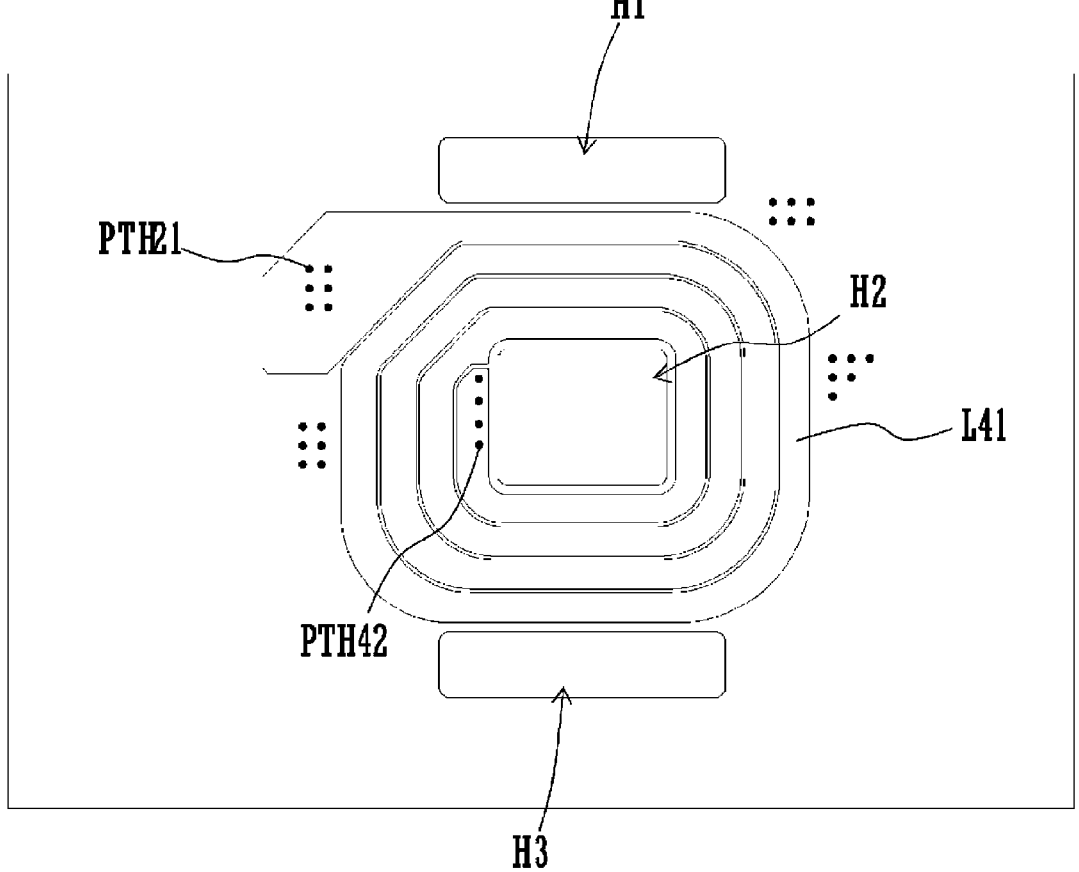
FIG. 10 is a plan view of a conductor pattern located on a layer S7 of the multilayer substrate shown in FIG. 3.

As shown in FIG. 10, a spiral four-turn coil conductor pattern L41 is preferably arranged around the hole H2 on the layer S7. The conductor through holes PTH21 are located at the outer periphery end of the coil conductor pattern L41, and conductor through holes PTH42 are located at the inner periphery end of the coil conductor pattern L41.

Figure 11:
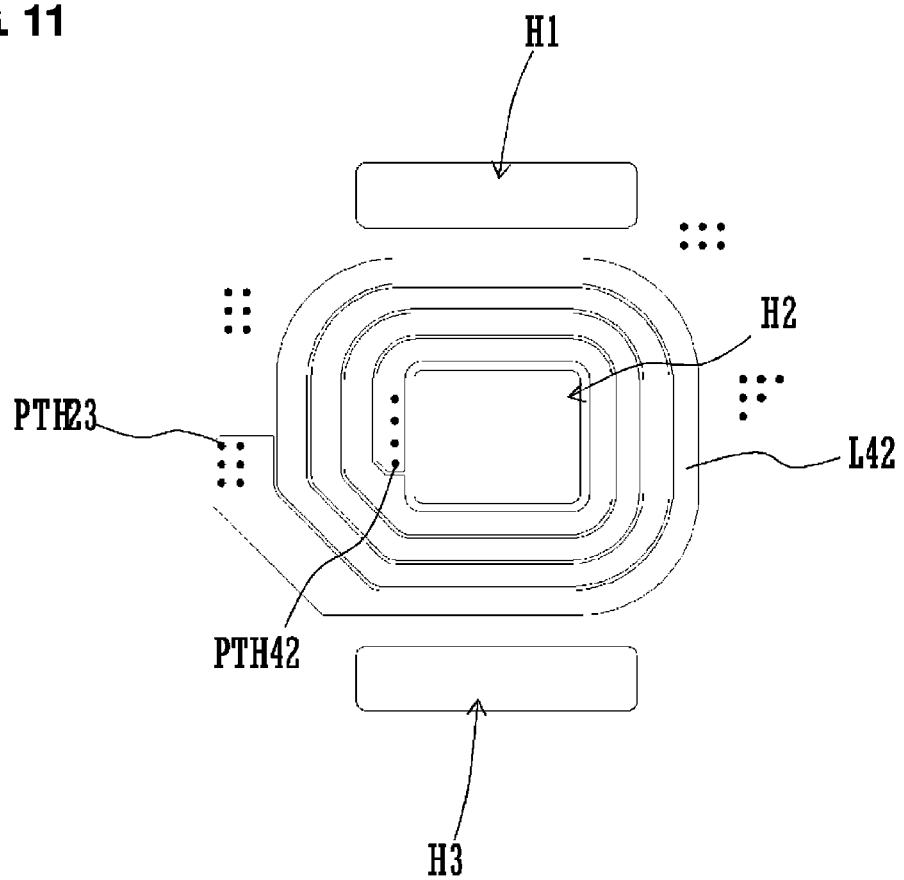
FIG. 11 is a plan view of a conductor pattern located on a layer S8 of the multilayer substrate shown in FIG. 3.

As shown in FIG. 11, a spiral four-turn coil conductor pattern L42 is preferably arranged around the hole H2 on the layer S8. The conductor through holes PTH42 are located at the inner periphery end of the coil conductor pattern L42, and the conductor through holes PTH23 are located at the outer periphery end of the coil conductor pattern L42.

The coil conductor pattern L41 is connected in series to the coil conductor pattern L42 via the conductor through holes PTH42 in the above manner to define one coil having a total of eight turns.

Figure 12:
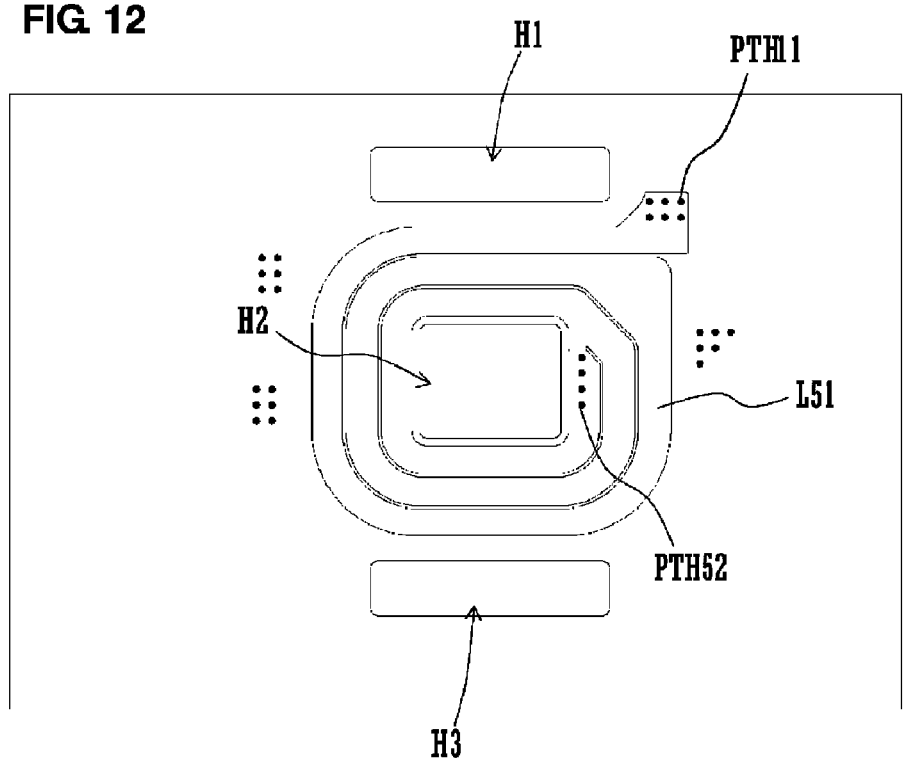
FIG. 12 is a plan view of a conductor pattern formed on a layer S9 of the multilayer substrate shown in FIG. 3.

As shown in FIG. 12, a spiral three-turn coil conductor pattern L51 is preferably arranged around the hole H2 on the layer S9. The conductor through holes PTH11 are located at the outer periphery end of the coil conductor pattern L51, and conductor through holes PTH52 are located at the inner periphery end of the coil conductor pattern L51.

Figure 13:
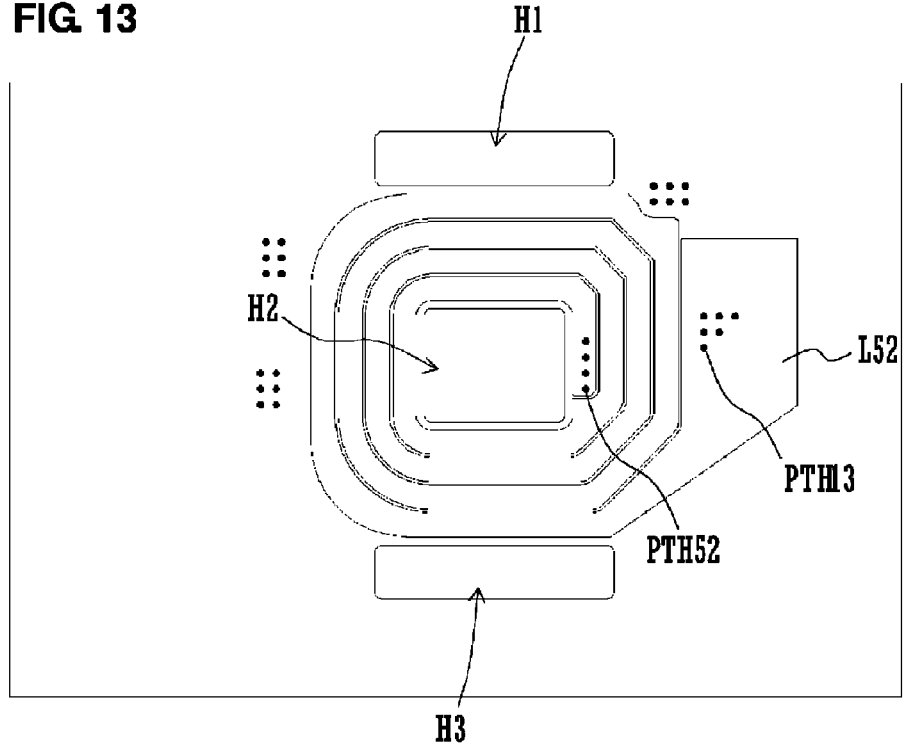
FIG. 13 is a plan view of a conductor pattern located on a layer S10 of the multilayer substrate shown in FIG. 3.

As shown in FIG. 13, a spiral four-turn coil conductor pattern L52 is preferably arranged around the hole H2 on the layer S10. The conductor through holes PTH52 are located at the inner periphery end of the coil conductor pattern L52, and the conductor through holes PTH13 are located at the outer periphery end of the coil conductor pattern L52.

The coil conductor pattern L51 is connected in series to the coil conductor pattern L52 via the conductor through holes PTH52 in the above manner to define one coil having a total of seven turns.

The seven-turn coil including the series connection between the coil conductor patterns L11 and L12, the seven-turn coil including the series connection between the coil conductor pattern L30 and the return line E61, and the seven-turn coil including the series connection between the coil conductor patterns L51 and L52 are connected in parallel to each other via the conductor through holes PTH11 and PTH13 to define a seven-turn primary coil.

The eight-turn coil including the series connection between the coil conductor patterns L21 and L22 and the eight-turn coil including the series connection between the coil conductor patterns L41 and L42 are connected in parallel to each other via the conductor through holes PTH21 and PTH23 to define an eight-turn secondary coil.

The seven-turn primary coil and the eight-turn secondary coil are stacked in a sandwich structure and are magnetically coupled to each other with the same magnetic core to define a printed coil transformer having a high degree of coupling.

The formation of the thermal diffusion conductor pattern E60 on the inner layer of the multilayer substrate causes the heat radiated from the spiral coil conductor patterns L11, L12, L21, L22, L30, L41, L42, L51, and L52 to be efficiently diffused in all directions with the thermal diffusion conductor pattern E60, to be conducted to the outermost layer of the substrate through the layered structure, and to be dissipated outside the switching power supply module. Accordingly, the areas where the coil conductor patterns are located in the multilayer substrate are prevented from being at high temperature intensively to keep the temperature of the entire coil-integrated switching power supply module at a low value.

In addition, the thermal diffusion conductor pattern E60 does not define a closed loop around the hole through which the magnetic core extends (does not extend around the hole) because of the presence of the slits SL1. Consequently, no eddy current flows through the thermal diffusion conductor pattern E60 to eliminate the energy loss caused by the eddy current, thereby preventing a decrease in the power conversion efficiency and an increase in the heat value.

Furthermore, since the thermal diffusion conductor pattern E60 is located on the layer other than the layers of the outermost substrates B1 and B5, there is no need to provide a special layer for the thermal diffusion and an increase in the number of layers of the multilayer substrate is prevented.

The coil conductor patterns are preferably located on both sides of the respective substrates B1, B2, B4, and B5 shown in FIG. 3. In contrast, the spiral coil conductor pattern is preferably located on the layer S5, which is one surface of the substrate B3, and the thermal diffusion conductor pattern is located on almost the entire surface of the rear surface layer S6, except the return line portion E61 from the inner side of the coil to the outer side thereof on the layer S5.

The spiral coil pattern located on the layer S5 is connected in parallel to the coil patterns provided in the substrates B1 and B5 to share the coil current. Such a structure allows the layer S5, which is the rear surface of the layer S6 on which the thermal diffusion pattern E60 is located, to be effectively used to reduce the resistance of the coils. In addition, the number of layers in the sandwich structure is increased to improve the degree of coupling of the printed coil transformer.

Second Preferred Embodiment

Figure 14:
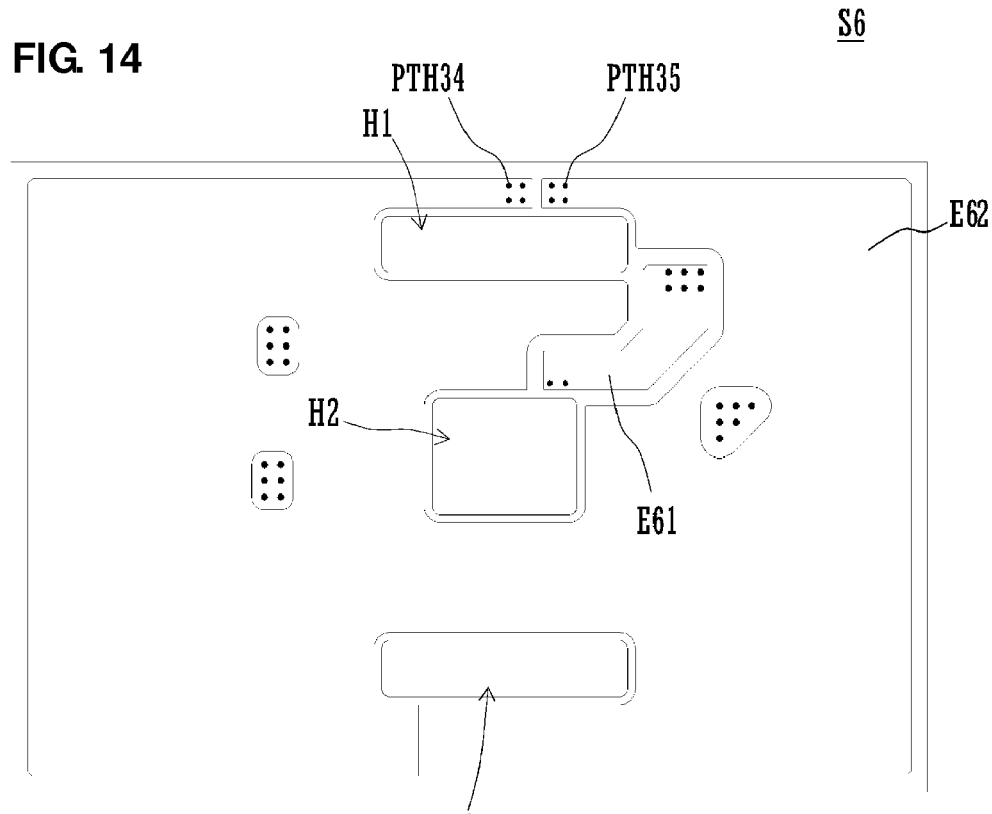
FIG. 14 is a plan view of conductor patterns located on a layer S6 of a multilayer substrate provided in a coil-integrated switching power supply module according to a second preferred embodiment of the present invention.

A coil-integrated switching power supply module according to a second preferred embodiment of the present invention will now be described with reference to FIG. 14. FIG. 14 is a plan view of conductor patterns located on a layer S6 of a multilayer substrate provided in the coil-integrated switching power supply module according to the second preferred embodiment. The layer S6 corresponds to the layer S6 shown in FIG. 9 in the first preferred embodiment but is different from the layer S6 in FIG. 9 in the conductor patterns. The conductor patterns on the other layers are preferably the same as those shown in the first preferred embodiment.

As shown in FIG. 14, an expansion coil conductor pattern E62 is preferably arranged around the hole H2 on the layer S6. This expansion coil conductor pattern E62 continuously extends in the areas where the coil conductor patterns are located on the other multiple layers and outside the areas where the coil conductor patterns are located on the other multiple layers. In this example, the expansion coil conductor pattern E62 extends into the periphery of the substrate. The expansion coil conductor pattern E62 preferably is a one-turn coil extending around the hole H2. Conductor through holes PTH34 are located at one end of the expansion coil conductor pattern E62 and conductor through holes PTH35 are located at the other end thereof. A circuit connecting to the conductor through holes PTH34 and PTH35 preferably uses the expansion coil conductor pattern E62 as the one-turn coil.

As described above, the formation of the expansion coil conductor pattern E62 on the inner layer of the multilayer substrate causes the heat radiated from the multiple coil conductor patterns located on the other layers to be efficiently diffused in all directions with the expansion coil conductor pattern E62. Accordingly, the areas where the coil conductor patterns are provided in the multilayer substrate are prevented from being at high temperature intensively to keep the temperature of the entire coil-integrated switching power supply module at a low value. The other operational effects are the same as those in the first preferred embodiment of the present invention described above.

Third Preferred Embodiment

Figure 15:
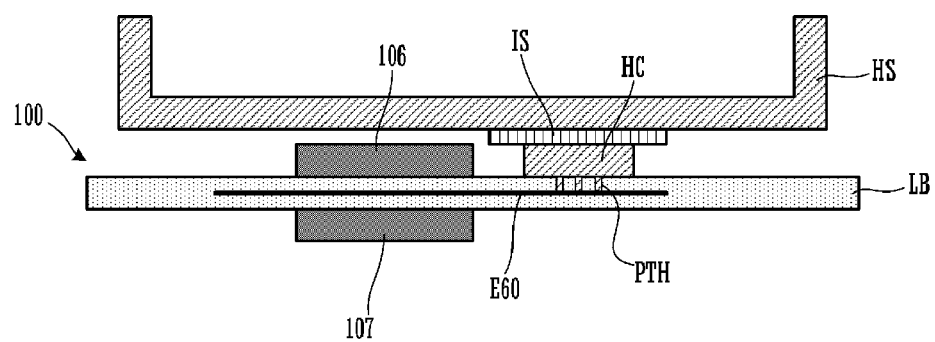
FIG. 15 is a cross-sectional view of an electronic device including a coil-integrated switching power supply module 100 according to a third preferred embodiment of the present invention.

A coil-integrated switching power supply module according to a third preferred embodiment of the present invention will now be described with reference to FIG. 15. FIG. 15 is a cross-sectional view of an electronic device including a coil-integrated switching power supply module 100 according to the third preferred embodiment. Referring to FIG. 15, a multilayer substrate LB preferably is the multilayer substrate of the coil-integrated switching power supply module shown in the first preferred embodiment. This multilayer substrate LB and magnetic cores 106 and 107 define the coil-integrated switching power supply module 100.

The thermal diffusion conductor pattern E60 is provided in the multilayer substrate LB, as shown in the first preferred embodiment. A mounting electrode for a thermal coupling member HC is located on the upper surface of the multilayer substrate LB and the thermal coupling member HC is mounted on the mounting electrode.

Conductor through holes PTH are located between the mounting electrode and the thermal diffusion conductor pattern E60. The conductor through holes PTH operate as heat transfer members that thermally couple the mounting electrode to the thermal diffusion conductor pattern E60.

A heat-transfer insulating sheet IS is provided between the thermal coupling member HC and a heat sink HS.

With such a structure, the heat to be diffused by the thermal diffusion conductor pattern E60 (the large portion thereof) is transferred on a path of the conductor through holes PTH→the thermal coupling member HC→the heat-transfer insulating sheet IS→the heat sink HS and is efficiently radiated outside.

Since the heat of the thermal diffusion conductor pattern E60 is radiated along the above-described flow path, it is not necessary to provide the thermal diffusion conductor pattern E60 on the entire surface of the substrate and it is sufficient for the thermal diffusion conductor pattern E60 to be provided in at least the areas where the coil conductor patterns are located.

Although the heat of the thermal diffusion conductor pattern E60 is preferably led outside in the example in FIG. 15, the heat of the expansion coil conductor pattern (the expansion coil conductor pattern E62 shown in FIG. 14) may also be led outside, as shown in the second preferred embodiment.

Although the heat sink HS is preferably provided as an external heat radiation member in the example of FIG. 15, the case of the electronic device may be used as the heat radiation member.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A coil-integrated switching power supply module comprising:
   a multilayer substrate in which spiral coil conductor patterns are provided on multiple layers, holes are located at an inner side and an outer side of each of the coil conductor patterns, and circuit element mounting electrodes are located on outer surfaces of the multilayer substrate;
   a magnetic core that extends through the holes located at the inner side and the outer side of each of the coil conductor patterns of the multilayer substrate to define a closed magnetic circuit; and
   circuit elements mounted on the circuit element mounting electrodes; wherein
   a thermal diffusion conductor pattern is located on an inner layer of the multilayer substrate, the thermal diffusion conductor pattern continuously extends in areas where the coil conductor patterns are located and outside the areas where the coil conductor patterns are located, and the thermal diffusion conductor pattern does not define a closed loop around the hole through which the magnetic core extends.

2. A coil-integrated switching power supply module comprising:
   a multilayer substrate in which spiral coil conductor patterns are provided on multiple layers, holes are located at an inner side and an outer side of each of the coil conductor patterns, and circuit element mounting electrodes are located on outer surfaces of the multilayer substrate;

a magnetic core that extends through the holes located at the inner side and the outer side of each of the coil conductor patterns of the multilayer substrate to define a closed magnetic circuit; and circuit elements mounted on the circuit element mounting electrodes; wherein at least one of the coil conductor pattern includes one turn and is an expansion coil conductor pattern that continuously extends outside areas where the coil conductor patterns are located.

3. The coil-integrated switching power supply module according to claim 1, wherein a thermal coupling member for heat radiation to an external heat radiation member is provided on at least one outer surface of the multilayer substrate and conductor through holes are provided between the thermal diffusion conductor pattern and the thermal coupling member.

4. The coil-integrated switching power supply module according to claim 2, wherein a thermal coupling member for heat radiation to an external heat radiation member is provided on at least one outer surface of the multilayer substrate and conductor through holes are provided between the expansion coil conductor pattern and the thermal coupling member.

* * * * *